(12) United States Patent
Zhou et al.

(10) Patent No.: US 9,070,692 B2
(45) Date of Patent: Jun. 30, 2015

(54) SHIELDS FOR MAGNETIC MEMORY CHIP PACKAGES

(71) Applicant: Avalanche Technology Inc., Fremont, CA (US)

(72) Inventors: Yuchen Zhou, San Jose, CA (US); Bernardo Sardinha, Gilroy, CA (US); Rajiv Yadav Ranjan, San Jose, CA (US); Ebrahim Abedifard, Sunnyvale, CA (US); Roger Klas Malmhall, San Jose, CA (US); Zihui Wang, Fremont, CA (US); Yiming Huai, Pleasanton, CA (US); Jing Zhang, Los Altos, CA (US)

(73) Assignee: Avalanche Technology, Inc., Fremont, CA (US)

( * ) Notice: Subject to any disclaimer, the term of this patent is extended or adjusted under 35 U.S.C. 154(b) by 176 days.

(21) Appl. No.: 13/740,180

(22) Filed: Jan. 12, 2013

(65) Prior Publication Data

US 2014/0197505 A1 Jul. 17, 2014

(51) Int. Cl.
*H01L 23/552* (2006.01)
*H01L 23/00* (2006.01)

(52) U.S. Cl.
CPC .............. *H01L 23/552* (2013.01); *H01L 24/48* (2013.01); *H01L 2224/16225* (2013.01); *H01L 2224/32225* (2013.01); *H01L 2224/48091* (2013.01); *H01L 2224/73204* (2013.01); *H01L 2224/73265* (2013.01); *H01L 2924/15174* (2013.01); *H01L 2924/15311* (2013.01)

(58) Field of Classification Search
CPC .............................. H01L 43/02; H01L 23/552
USPC .................................. 257/421, 422, 659, 660
See application file for complete search history.

(56) References Cited

U.S. PATENT DOCUMENTS

| | | |
|---|---|---|
| 4,953,002 A | 8/1990 | Nelson et al. |
| 5,561,265 A | 10/1996 | Livshits et al. |
| 5,902,690 A | 5/1999 | Tracy et al. |
| 5,939,772 A | 8/1999 | Hurst et al. |
| 6,627,932 B1 | 9/2003 | Drewes |
| 6,906,396 B2 | 6/2005 | Tuttle et al. |
| 6,936,763 B2 | 8/2005 | Rizzo et al. |
| 7,183,617 B2 | 2/2007 | Wang et al. |
| 7,459,769 B2 | 12/2008 | Kato et al. |
| 7,545,662 B2 | 6/2009 | Wang et al. |
| 7,598,596 B2 | 10/2009 | Molla et al. |
| 7,687,283 B2 | 3/2010 | Terui |
| 7,772,679 B2 | 8/2010 | Chang et al. |
| 7,815,820 B2 * | 10/2010 | Tan et al. ................... 252/518.1 |
| 8,125,057 B2 | 2/2012 | Bonin et al. |
| 2012/0126382 A1* | 5/2012 | Katti ............................. 257/660 |
| 2012/0211846 A1* | 8/2012 | Li et al. ......................... 257/421 |

* cited by examiner

*Primary Examiner* — Matthew W Such
*Assistant Examiner* — Scott Stowe
(74) *Attorney, Agent, or Firm* — G. Marlin Knight; Bing K. Yen

(57) ABSTRACT

Chip packages are described with soft-magnetic shields that are included inside or attached externally to the package containing a MRAM chip. In one group of embodiments a single shield with vias for bonding wires is affixed to the surface of the MRAM chip having the contact pads. The limitation of shield to chip distance due to bonding wire is eliminated by VIA holes according to the invention which achieves minimal spacing between the shield and chip. A second shield without vias can be positioned on the opposite side of the chip from the first shield. In one group of embodiments a hardened ferro-fluid shield can be the only shield or the structure can include a shield with or without vias. One group of embodiments includes an external shield with vias for solder access to the package contact pads affixed to the outer surface of the package.

27 Claims, 15 Drawing Sheets

SHIELDS FOR MAGNETIC MEMORY CHIP PACKAGES

FIELD OF THE INVENTION

The invention relates generally to design and fabrication methods for packages for magnetic memory chips.

BACKGROUND OF THE INVENTION

Integrated circuit chips, such as magnetic random access memory (MRAM) chips, are typically encapsulated in protective packages that provide electrical connection pin or pads for soldering onto printed circuit boards. Magnetic random access memory (MRAM) based on magneto-resistive (MR) technologies, especially the magnetic tunnel junction (MTJ) based spin transfer torque magnetic random access memory (STT-MRAM), is regarded as next generation memory that has potential to replace many existing memory technologies (flash, DRAM, SRAM) and create new applications. A typical STT-MRAM MTJ) stack has a pinned reference layer whose magnetization is fixed in certain direction by either intrinsic anisotropy field, or through an exchange coupling field from an adjacent magnetic layer. It also has a switchable free layer, whose magnetization direction can be switched relative to that of the reference layer by an electric current flowing between the reference layer and free layer through an junction layer, typically an oxide of Mg, Al and Ti, or a metallic layer of Cu, Au, or Ag. Different relative angles of the magnetization directions between the free layer and reference layer result in different resistance levels across the MTJ stack. Thus, by switching the free layer magnetization directions with the electric current, an STT-MRAM can be switched into high and low resistance states that are persistent and can be used to represent data bits.

However, due to the free layer being a layer made of magnetic material, it can also be switched or perturbed by an externally applied magnetic field, when the field strength is strong enough (e.g. 100 Gauss or higher). Therefore, shielding is generally required for STT-MRAM product to function properly as a data storage device without being perturbed or erased by unwanted external fields from the environment. Typically one or more magnetic shields shaped into blocks or sheets are positioned close to STT-MRAM chip in the chip-packaging process. The shields, under the external magnetic fields, are supposed to produce a counteracting field at the MTJ locations of the MRAM chip and reduce the total field on the MTJ. The chip should experience a weaker effective field than the external field applied to the MRAM product and perturbation is reduced. However, the prior art has limited success in shielding packaged MRAM products.

Because shielding must not conflict with the bonding wires, single or multiple sheet shields can be positioned too far away from the MRAM chip, so that the shield effect is degraded seriously by the distance between shield and chip's MTJ baring surface (U.S. Pat. No. 4,953,002, U.S. Pat. No. 5,939,772, U.S. Pat. No. 6,906,396, U.S. Pat. No. 7,459,769).

Partial-wrap-around or full-wrap-around shield can cause additional cost and difficulty in the packaging process. (U.S. Pat. No. 5,561,265, U.S. Pat. No. 7,183,617, U.S. Pat. No. 6,936,763, U.S. Pat. No. 7,545,662, U.S. Pat. No. 7,687,283, U.S. Pat. No. 7,772,679).

Coating or electro-depositing the shield material onto chip or wafer surface adds additional cost for wafer manufacturing and does not allow for sufficiently large thickness magnetic material (generally <100 um thickness) to produce a high enough cancelling field at MTJ. (U.S. Pat. No. 8,125,057, U.S. Pat. No. 5,902,690, U.S. Pat. No. 6,936,763, U.S. Pat. No. 6,627,932, U.S. Pat. No. 7,598,596, U.S. Pat. No. 7,545, 662, U.S. Pat. No. 7,772,679).

When the shield's largest physical dimension is smaller than the MRAM chip size, this limits the cancelling field being generated at the edge of the chip and thus limits the area of the chip that can be used for MRAM data storage MTJ cells.

What is needed is a shield design that can a) position a large volume soft-magnetic shielding material with size being able to cover the largest physical size of the MRAM chip; b) with minimal distance to the MTJ bearing surface of the MRAM chip; and c) at same time, being achievable at chip-packaging step and with low cost.

FIGS. 1A and 1B will be used to discuss how magnetic shielding works. MRAM Chip 10 is subjected to applied magnetic field flux 11. When MRAM chip is exposed to an external magnetic field, the magnetic field may perturb or even erase the stored information by rotating or switching the magnetization of the data storage layer, i.e. free layer, of the MTJ cell. To reduce the undesired effect of the magnetic field on the MTJ cell, magnetically soft shielding 12 is used to reduce the effective field that is acting on the MRAM chip. The soft magnetic shield is easily magnetized by the applied field and shield magnetization is aligned in the same direction as the applied field. The magnetization of the shield produces positive and negative magnetic charges 13 on the two opposite ends of the shield. These positive and negative magnetic charges on the surface of the shield produce a magnetic field outside the shield body, which acts against the external applied magnetic field magnetization.

The effect of combining the applied magnetic field and the field generated by the shield magnetization is that the magnetic flux, whose spatial density reflects the magnetic field strength, is concentrated and conducted by the shield material. Space close to the shield material is effectively depleted of the magnetic field. Positioning an MRAM chip close to the shield material can help reduce the effective magnetic field that the chip is experiencing under a given applied magnetic field. The wire-bonding surface of the MRAM chip is usually the MTJ bearing surface. This surface needs to be as close to the shielding material as possible. The shield material size needs to be substantial large enough, especially in thickness, to attract enough magnetic flux and provide effective shielding. Shield thickness is preferably larger than the thickness of the MRAM chip thickness, and typically, 0.1 mm to a few millimeters. However, shield deposition in the wafer process cannot achieve such thickness economically or practically. By positioning an MRAM chip in between two shielding blocks, effective shielding can be further enhanced. However, enhancement is still dependent on the volume and size of the shields and the distance from shield to MRAM chip. If the shield is too thin or too far away from the MRAM chip, it fails to adequately shield. The preferred position of MRAM chip is always as close to the shield as possible.

Alternatively, a full wrap-around shield can effectively shield the MRAM chip from a field that has reasonable amplitude (less than 1k Gauss). But the cost associated with realizing a full wrap-around shield is high and may prove impractical for commercial products.

What is needed is a shield design that can position a large volume of magnetically soft shielding material over an area large enough to cover the largest physical size of the MRAM chip. The thickness should be no thinner than the MRAM chip itself, and there should be minimal distance to the MTJ bearing surface of the MRAM chip. The fabrication of the shield should be achievable at chip-packaging step and with low cost.

SUMMARY OF THE INVENTION

Embodiments of the invention include one or more soft-magnetic shields that are included inside or attached externally to the package containing a MRAM chip. The soft-magnetic shields preferably have an in-plane extent larger than the memory cell bearing surface of the MRAM chip and a thickness perpendicular to the memory cell bearing surface that is greater than thickness MRAM chip.

In one group of embodiments a single shield with vias for bonding wires is affixed to the surface of the MRAM chip having the contact pads. The limitation of shield-to-chip distance due to bonding wire is eliminated by VIA holes according to the invention which achieves minimal spacing between the shield and chip. The chip and shield can be upward or downward facing inside the package. The vias can be configured so that a single bonding wire passes through a via or the vias can be larger so that multiple wires can pass through a single via. The vias can be variously shaped, but smooth edges of circular and elliptical shapes are preferable. The vias can be formed by creating holes in a single piece of shield material, or two or more pieces of shield material can be juxtaposed to form the vias. The shields can be laminates of magnetic layers and non-magnetic spacers. The magnetic layer can be ferromagnetic, ferri-magnetic, or super-para-magnetic.

A second shield without vias is included in some embodiments. The second shield is positioned on the opposite side of the chip from the first shield.

In one group of embodiments a magnetic shield structure is formed by depositing a liquid containing magnetic particles (which will be call a "ferro-fluid") over the assembled structures inside the open-ended package. The ferro-fluid can remain liquid in some embodiments but in other embodiments a hardenable ferro-fluid matrix is used. When the liquid matrix hardens a permanent, solid shield is formed. In various embodiments the upper component in the assembled structures inside the open-ended package is the non-contact-pad side MRAM chip, a shield with vias and bonding wires, or the contact-pad side MRAM chip with bonding wires. The hardened ferro-fluid shield can be the only shield or the structure can include a shield with or without vias.

One group of embodiments includes an external shield with vias for solder access to the package contact pads affixed to the outer surface of the package.

DETAILED DESCRIPTION OF THE INVENTION

Figure 1A:
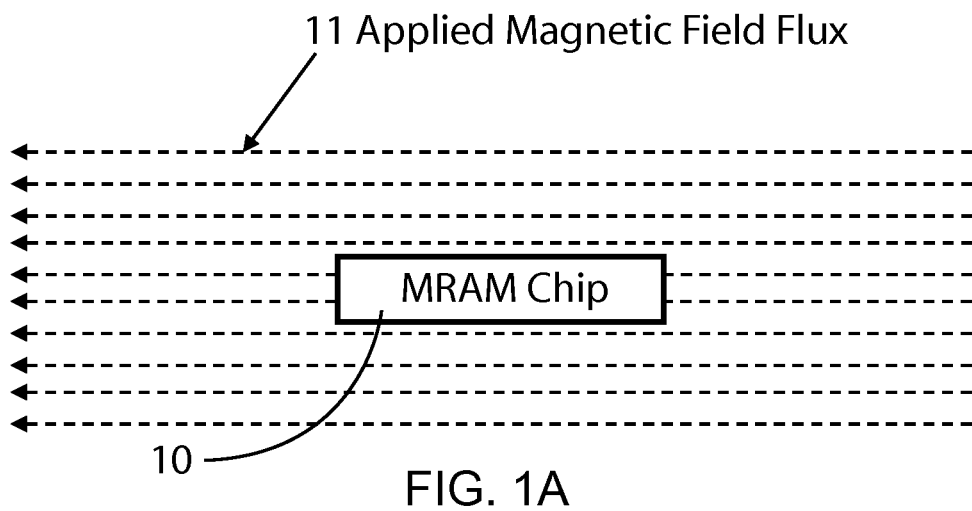
FIGS. 1A and 1B illustrate magnetic shielding principles according to the prior art.
Figure 1B:
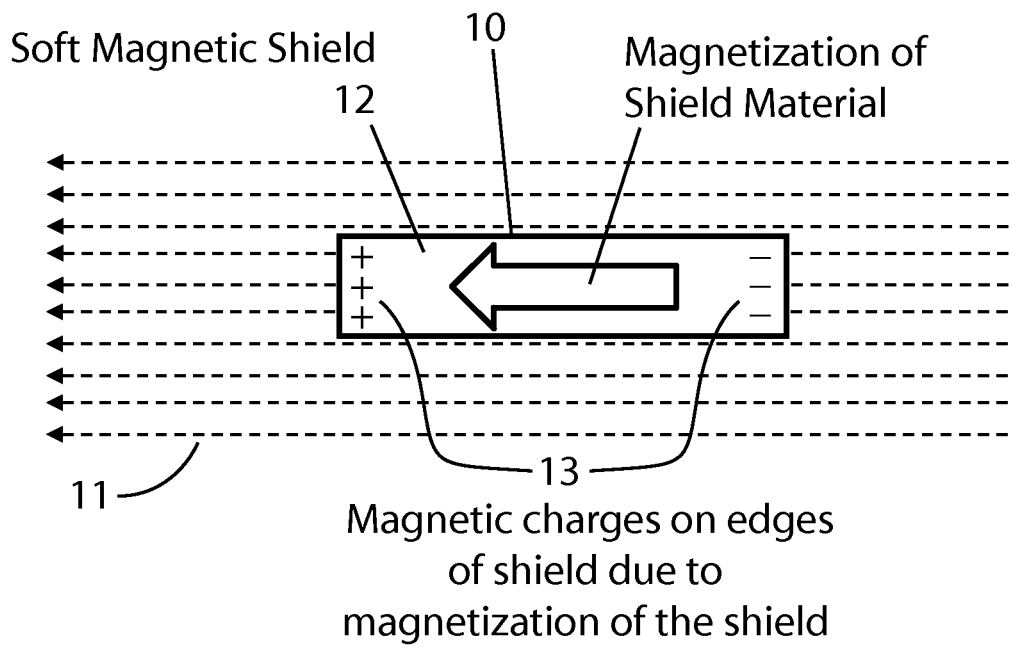

In the following description of the embodiments, reference is made to the accompanying drawings that form a part hereof, and in which is shown by way of illustration of the specific embodiments in which the invention may be practiced. The figures discussed herein are not drawn to scale and thicknesses of lines are not indicative of actual sizes. The cross section view in the figures is taken through a plane perpendicular to the substrate unless otherwise noted. Although only a small number of MRAM chip contact pads are shown in the figures for simplicity, the invention can be used with any number of features according to standard techniques. The contact pads in the drawings are shown in a single line which is illustrating cross-section view from the side for explanatory purposes, but a in practical embodiment there can be an array of matrix of contacts.

Figure 2:
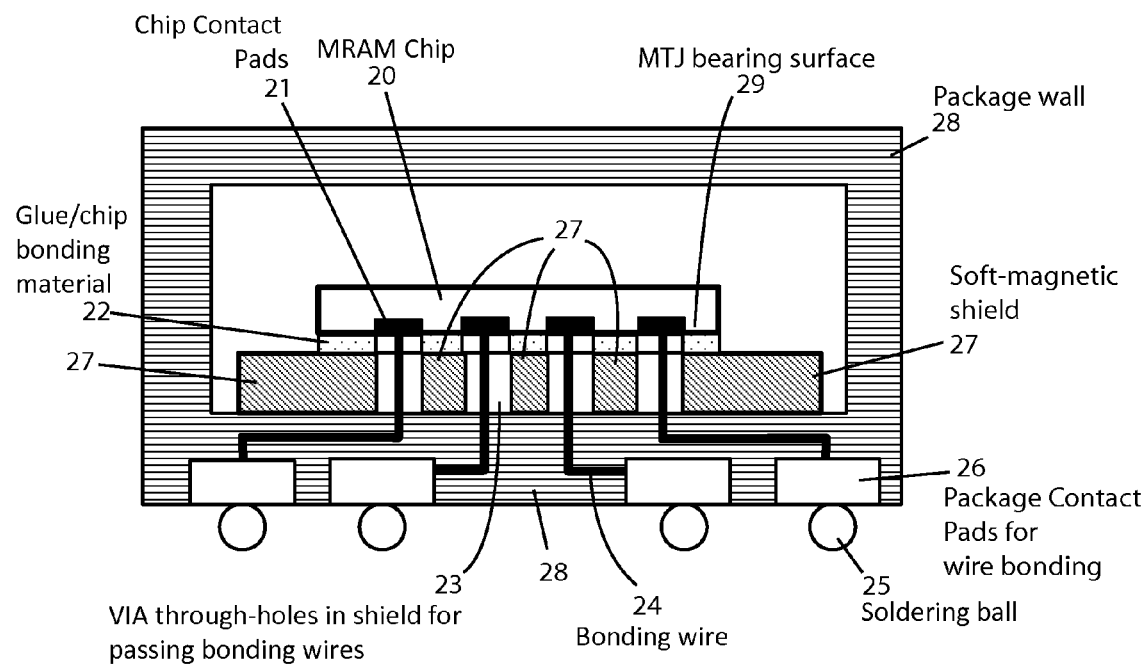
FIG. 2 illustrates a cross section view of a first embodiment of the invention using a single shield with multiple via holes.

FIG. 2 illustrates a cross section view of a first embodiment of the invention using a single shield with via holes. Prior art techniques either position the shield far away from the MTJ bearing surface with contact pads to avoid conflict with the bonding wires or reduce the shield size to be within the limit of the contact pad. In either case, the shielding strength is compromised, either due to large chip-shield distance or reduced shield size. The limitation of shield to chip distance due to bonding wire is eliminated by VIA holes according to the invention which achieves minimal spacing between the shield and chip.

The invention uses a soft-magnetic shield 27 having in-plane extent larger than the MTJ bearing surface 29 of MRAM chip 20. The thickness soft-magnetic shield 27 perpendicular to the MTJ bearing surface 29 (vertical in the figure) is also greater than thickness MRAM chip 20. The shield 27 is below MRAM chip 20 and is disposed between package-inside-bottom-surface of the package wall and the MRAM chip. The shield is attached or bonded to the package by any appropriate method include gluing, press in, soldering, molding into the package wall, tight fit to package inside space or package material melt during packaging process that bonds to shield when re-solidifies. The embodiment shown in FIG. 2 uses glue or bonding material 22. The shield 27 has a series of through-holes or vias 23 that align with the chip contact pads 21 on the surface of the MRAM chip. The vias 23 are sized with through clearances to allow for bonding wires 24 to pass through to make electrical contact with the contact pads 21. The bonding wires 24 are also respectively connected to the package contact pads 26 which provide the external connection points. Standard solder balls 25 are prepositioned to aid in making the future connections.

Figure 3A:
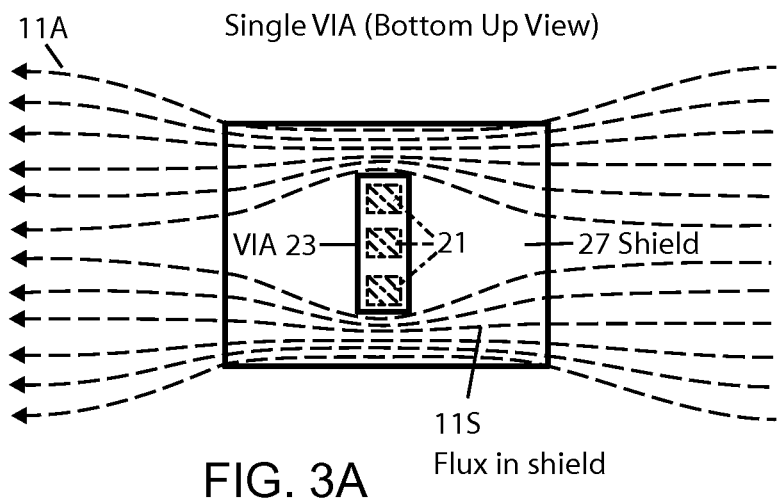
FIGS. 3A and 3B illustrate cross section views from the bottom looking up for an alternative of the first embodiment of the invention using a single shield with a single via hole.
Figure 3B:
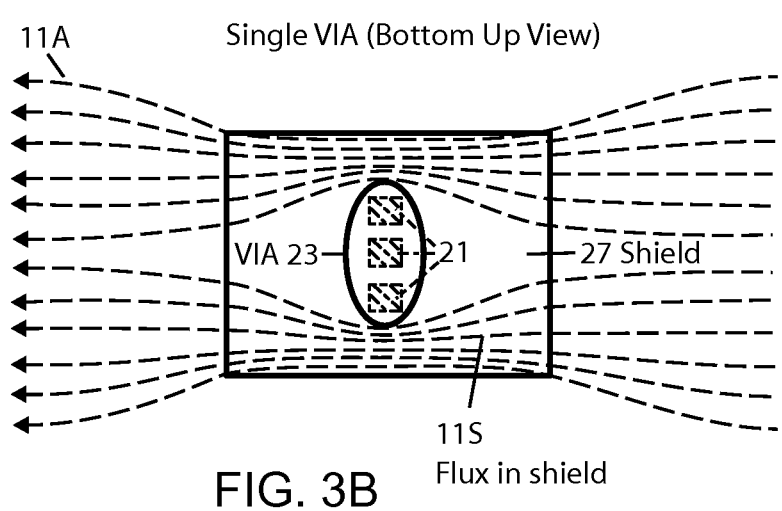

FIGS. 3A and 3B illustrate cross section views of the shield 27 from the bottom looking up for an alternative of the first embodiment of the invention using a single shield 27 with a single via hole 23. The chip contact pads 21 are shown in dotted lines to indicate they are above the shield as shown in FIG. 2. Although only 3 chip contact pads 21 are shown a practical embodiment would include many more pads. The bonding wires that pass through the via as shown in FIG. 2 are not shown in this and other views of the shield shapes for clarity. FIG. 3A illustrates a rectangular-shaped via and FIG. 3B illustrates an elliptical via. The shape of the single via 23 can be, for example, rectangular, square, circular, elliptical or polygonal. However, a via with curved edges (circular or elliptical) is preferred to minimize flux leakage from sharp corners of the via holes. The single via 23 results in flux conduction 11S within the shield as shown in the figures that goes around the via hole with minimal leakage of flux to the MRAM chip and, therefore, minimal field to affect MTJ free layers. Flux conduction paths 11A are outside of the shield.

Figure 4A:
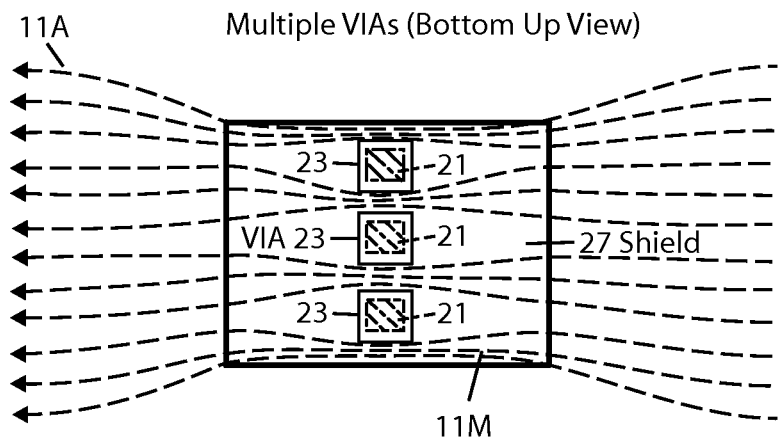
FIGS. 4A and 4B illustrate cross section views from the bottom looking up for an alternative of the first embodiment of the invention using a single shield with multiple via holes.
Figure 4B:
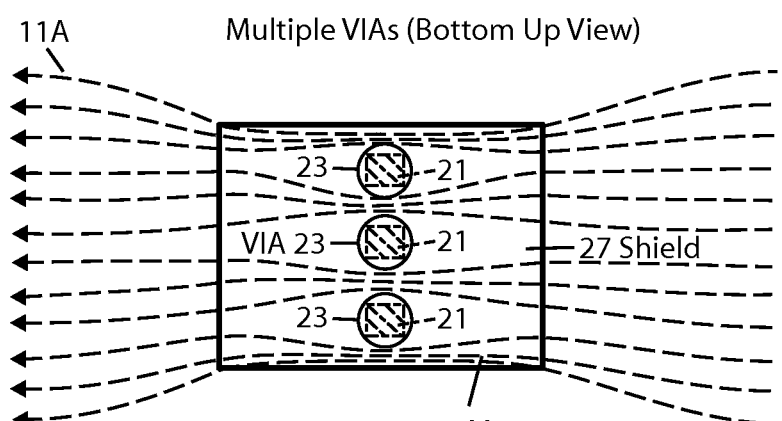

FIGS. 4A and 4B illustrate cross section views of the shield from the bottom looking up for an alternative of the first embodiment of the invention using a single shield with multiple via holes. FIG. 4A illustrates rectangular-shaped vias and FIG. 4B illustrates circular vias. The multiple vias 23 results in flux conduction 11M within the shield as shown in the figures that goes around the via holes but passes through the shield material between each of the via holes as shown.

Figure 5A:
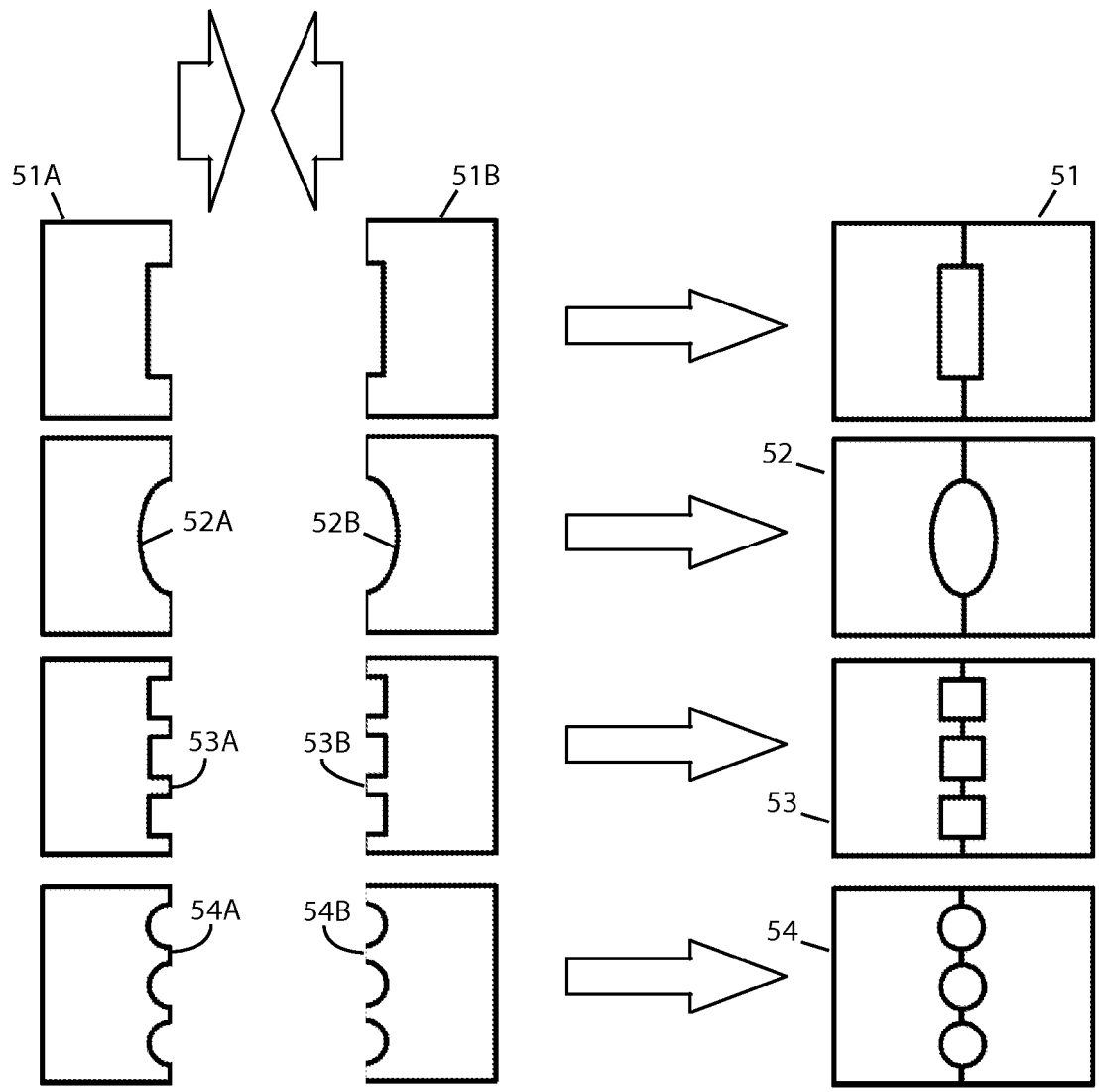
FIG. 5A illustrates several examples of shields with single or multiple vias that can be made by joining two shield pieces according to the invention.

Each type of shield with via holes can be formed in a single and un-broken piece of shield material through mechanical processes such as drilling, machining, pressing, or molding. Shields can also be formed by physically joining two or more shield pieces together to form a continuous magnetic flux path within the shield materials. The magnetic materials in the two pieces should be in physical contact. FIG. 5A illustrates several examples of shields with single or multiple vias that can be made by joining two shield pieces according to the invention. For example, shield pieces 51A, 51B are positioned to form shield 51 with a single rectangular via. Shield pieces 52A, 52B are positioned to form shield 52 with a single elliptical via. Shield pieces 53A, 53B are positioned to form shield 53 with a multiple square vias. Shield pieces 54A, 54B are positioned to form shield 54 with a multiple circular vias.

The shield materials for all of the embodiments of the invention will now be described. Options for the shield include:

(a) A homogeneous shield made from a soft magnetic material that can be being an alloy of Fe and/or Co and any of the following Ni, Mn, Ir, Mg, Al, Ta, Ti, Pt, Pd, Ru, Cr, Cu, Hf, Zr, Si, C, Ge, W, Nb, Nd, Zn, Au, Ag, Cu, Mo, V, Ru, O and N.

(b) Soft magnetic material formed by suspending magnetic particles in a non-magnetic matrix. The magnetic particles can be ferromagnetic, ferri-magnetic, or super-paramagnetic. The particle size can be from a few nanometers (e.g. 5 nm~500 nm) and one hundred microns. The particles can be composed of an alloy of Fe and/or Co and any of the following Ni, Mn, Ir, Mg, Al, Ta, Ti, Pt, Pd, Ru, Cr, Cu, Hf, Zr, Si, C, Ge, W, Nb, Nd, Zn, Au, Ag, Cu, Mo, V, Ru, O and N. The non-magnetic matrix can be any non-magnetic metal or alloy, polymer, oxide, carbide, nitride, silicide, carbonate, sulfate, or silicon.

Figure 5B:
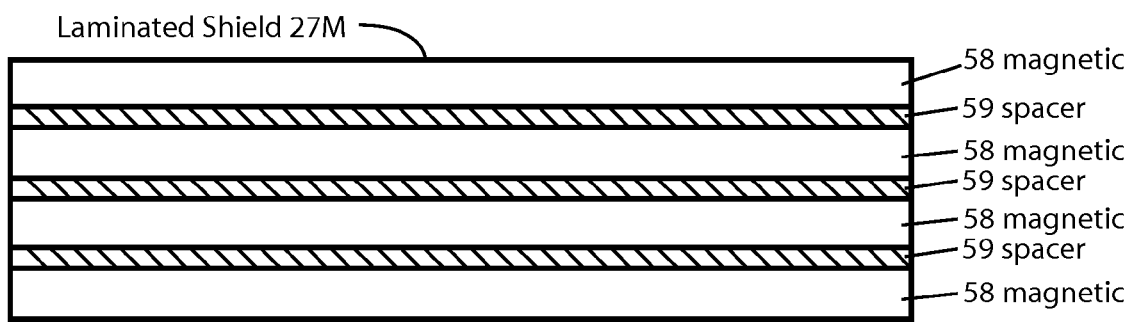
FIG. 5B illustrates a shield formed from laminated magnetic and spacer layers according to an embodiment of the invention.

(c) Soft magnetic material formed by laminates of magnetic layers 58 and non-magnetic spacers 59 as illustrated in FIG. 5B. In the illustration of shield 27M there are 4 magnetic layers 58 and 3 non-magnetic spacers 59, but other numbers of layer pairs can be used according to the prior art. The magnetic layer can be ferromagnetic, ferri-magnetic, or super-paramagnetic. The magnetic layer can be include an alloy of Fe and/or Co and any of the following Ni, Mn, Ir, Mg, Al, Ta, Ti, Pt, Pd, Ru, Cr, Cu, Hf, Zr, Si, C, Ge, W, Nb, Nd, Zn, Au, Ag, Cu, Mo, V, Ru, O and N. The non-magnetic spacer can be a non-magnetic metal or alloy, polymer, oxide, carbide, nitride, silicide, carbonate, sulfate, or silicon. Lamination of magnetic layers helps quench local fields on the MTJs of the MRAM chip induced by the domain-wall existing within the magnetic layers. Lamination of metallic magnetic layers, preferably metallic magnetic foils, helps make the shield be flexible during the packaging process which reduces stress on MRAM chip.

Figure 6:
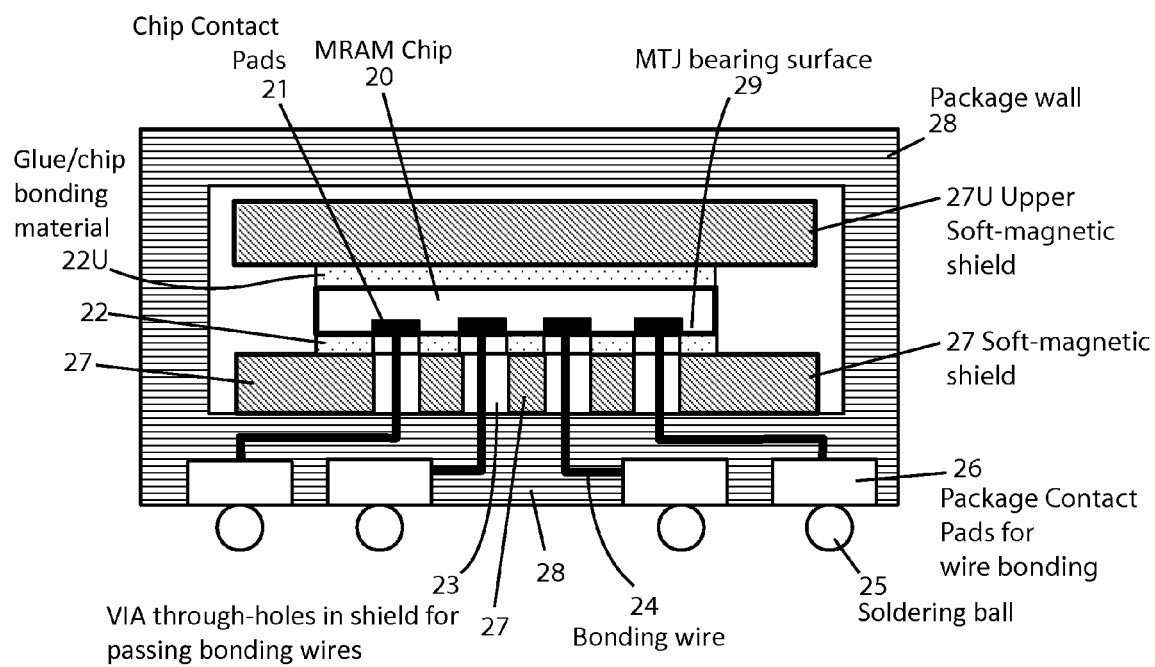
FIG. 6 illustrates a cross section view of a second embodiment of the invention using an upper and lower shield.

FIG. 6 illustrates a cross section view of a second embodiment of the invention using an upper and lower shield. This embodiment uses the same lower shield 27 but a upper shield 27U has been added above the MRAM chip. The upper shield 27U is bonded to the chip with an additional adhesive layer 22U. The upper shield 27U has no vias but otherwise can be formed according to the same principles described for shield 27. For example, the upper shield 27U should also be large enough in area to extend beyond the edges of the MRAM chip and thicker than the MRAM chip.

Figure 7:
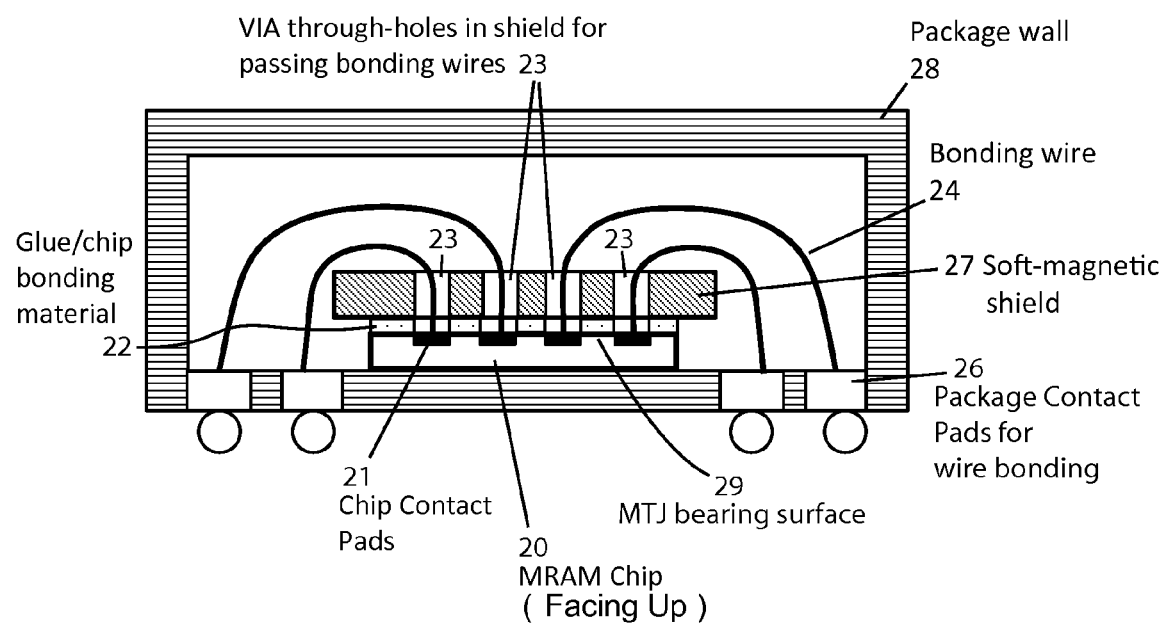
FIG. 7 illustrates a cross section view of a third embodiment of the invention using a shingle shield multiple via holes with an upward facing MRAM chip.

FIG. 7 illustrates a cross section view of a third embodiment of the invention using a single shield with multiple via holes with an upward facing MRAM chip. In this embodiment the bonding wires 24 go from the chip contact pads 21 (that are positioned on top of the MRAM chip 20) through the shield vias 23 and loop down to connect to the package contact pads 26. For the wires coming up through shield vias, the wire bonding process can be substantially the same as for the prior art.

Figure 8:
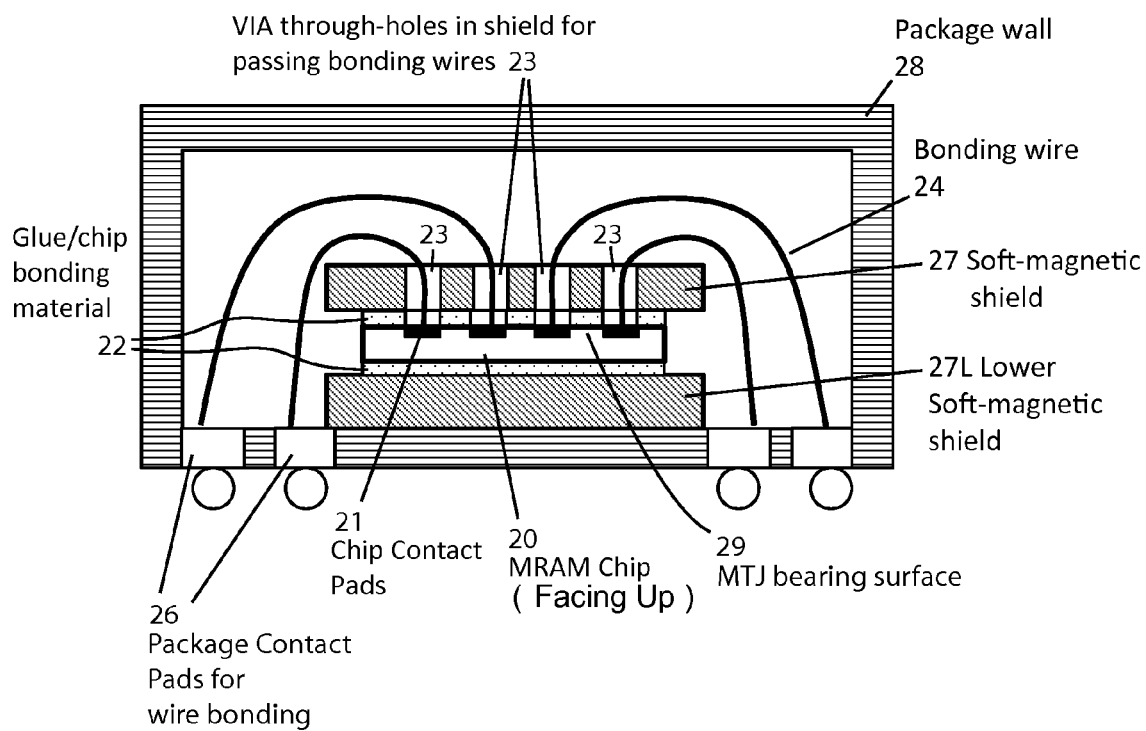
FIG. 8 illustrates a cross section view of a fourth embodiment of the invention using an upper and lower shield with an upward facing MRAM chip.

FIG. 8 illustrates a cross section view of a fourth embodiment of the invention using an upper and lower shield with an upward facing MRAM chip. This embodiment is similar to the third embodiment of FIG. 7 except that lower shield 27L has been added below the MRAM chip between the chip and the package wall. The chip is glued to the shield 27L.

Figure 9:
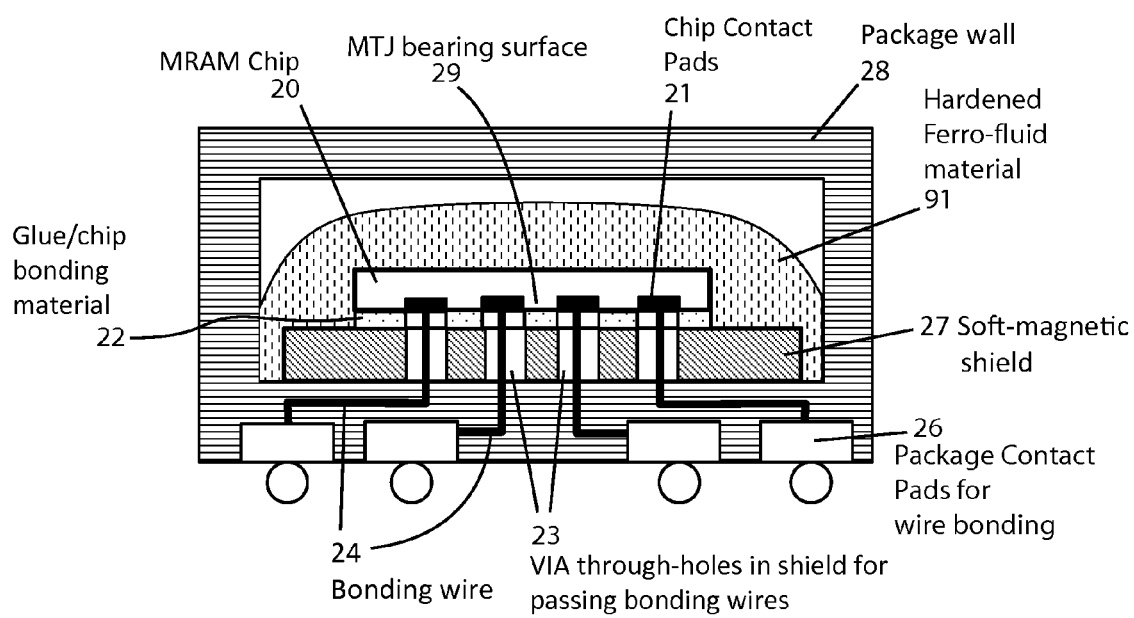
FIG. 9 illustrates a cross section view of a fifth embodiment of the invention using a single shield with multiple via holes and hardened ferro-fluid material cover over the shield.
Figure 10A:
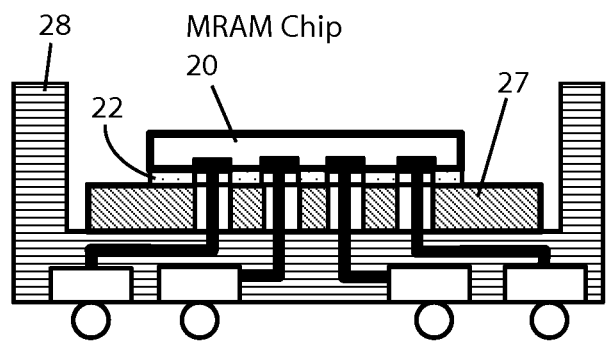
FIGS. 10A-C illustrate selected process stages for a fabrication method for the fifth embodiment of the invention.
Figure 10B:
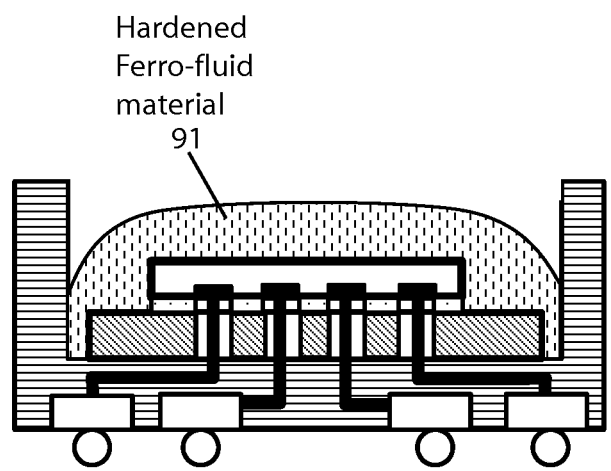
Figure 10C:
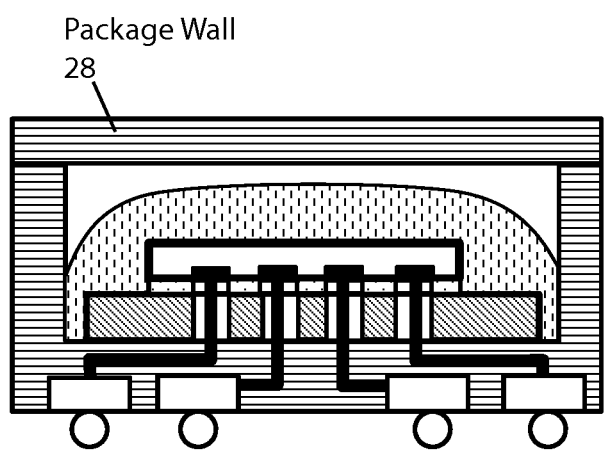

FIG. 9 illustrates a cross section view of a fifth embodiment of the invention using a single shield with multiple via holes and hardened ferro-fluid material cover 91 over the shield. This embodiment is similar to the first embodiment except that ferro-fluid material cover 91 has been added. FIGS. 10A-C illustrate selected process stages for a fabrication method for the fifth embodiment of the invention. After MRAM-chip has been glued/bonded to the shield 27, a liquid ferro-fluid material is disposed inside package space to form magnetic shielding on top and sides of the MRAM chip. The ferro-fluid material is based on a flowing matrix material such as oil, water, epoxy, silicone, glue, and any other polymer, organic or in-organic materials. The magnetic particles are suspended within the flowing matrix. The magnetic particles should be metallic or oxide particles of micron size or nanometer size and be ferro-magnetic, ferri-magnetic or superparamagnetic particles. The ferro-fluid material can be dropped into the package in flowing liquid form and then hardened by heating, or exposure to light (especially UV light), or during the heating from the packaging process. The process of hardening is preferred. However, in certain cases, un-hardened ferro-fluid may also be employed for packaging simplicity and fluid base flexibility. As a potentially beneficial side effect, the hardened ferro-fluid material with metallic magnetic particles may also help with dissipating heat of the MRAM chip during operation. Before the ferro-fluid material is placed, an optional coating process can be implemented to coat a thin layer of insulating material inside the package to insulate all MRAM chip and electrical connections from the ferro-fluid material.

As shown in FIG. 10A the shield 27 is first bonded to package 28 bottom surface. Next the MRAM chip 20 is bonded/glued to the shield. An optional step (not shown) at this stage is to coat relatively thin insulating material through the opening of the package by spray or vapor or other means, where the hardened ferro-fluid material does not need to be in physical contact with shield 27.

As shown in FIG. 10B droplets of ferro-fluid material 91 are deposited through the opening of the package to cover MRAM chip. In this embodiment as shown the ferro-fluid material makes contact with the exposed upper surface of the shield (where it extends beyond the MRAM chip). An optional step hardens or cures the flowing matrix material using heat, light or other physical means.

FIG. 10C shows the final state after the top opening in the package wall has been been sealed. This enclosure step may simultaneously hardened the ferro-fluid material due to heat and other physical causes that are present during the enclosing process.

Figure 11:
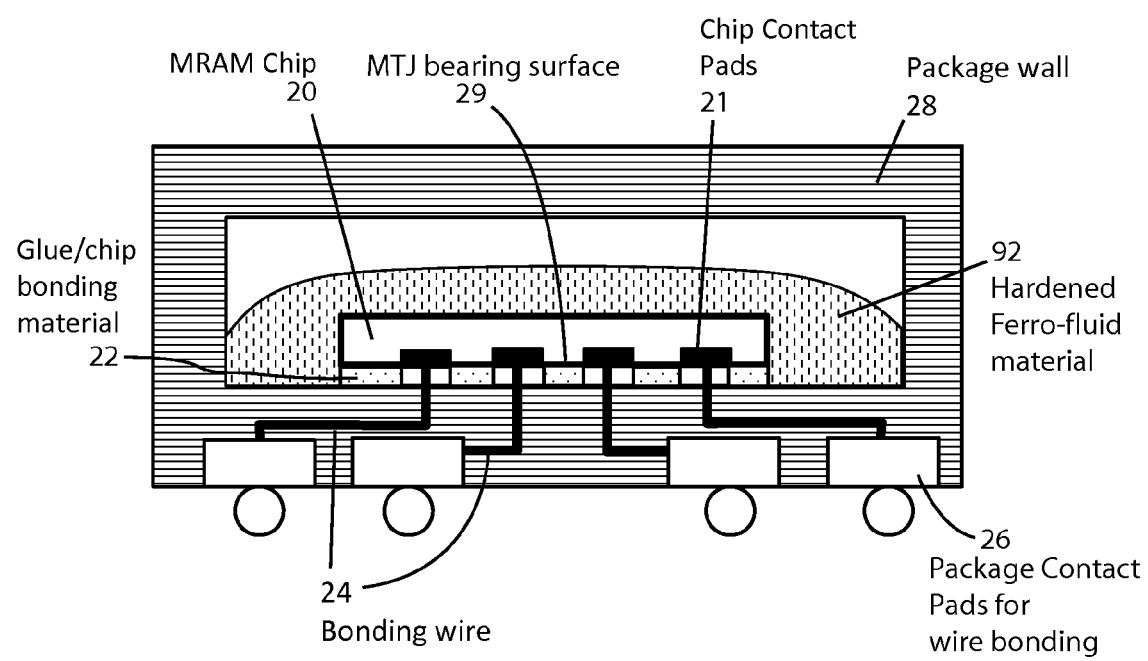
FIG. 11 illustrates a cross section view of a sixth embodiment of the invention that includes a magnetic shield formed from hardened ferro-fluid material deposited on top of the MRAM chip inside package space.

FIG. 11 illustrates a cross section view of a sixth embodiment of the invention that includes a magnetic shield 92 formed from ferro-fluid material deposited on top of the MRAM chip inside package space. This embodiment does not include a bottom shield with VIA holes. After MRAM-chip being glued/bond to the package (and optionally after wire bonding), a ferro-fluid material as described above is disposed inside the package space to form magnetic shielding on top of the MRAM chip. Before depositing the ferro-fluid material, optionally a thin layer of insulating material can be deposited inside the package to insulate the MRAM chip and electrical connections from the ferro-fluid material. Preferably, the ferro-fluid material is hardenable, where the hardenable ferro-fluid material specifications and deposition and hardening process are same as described above.

Figure 12:
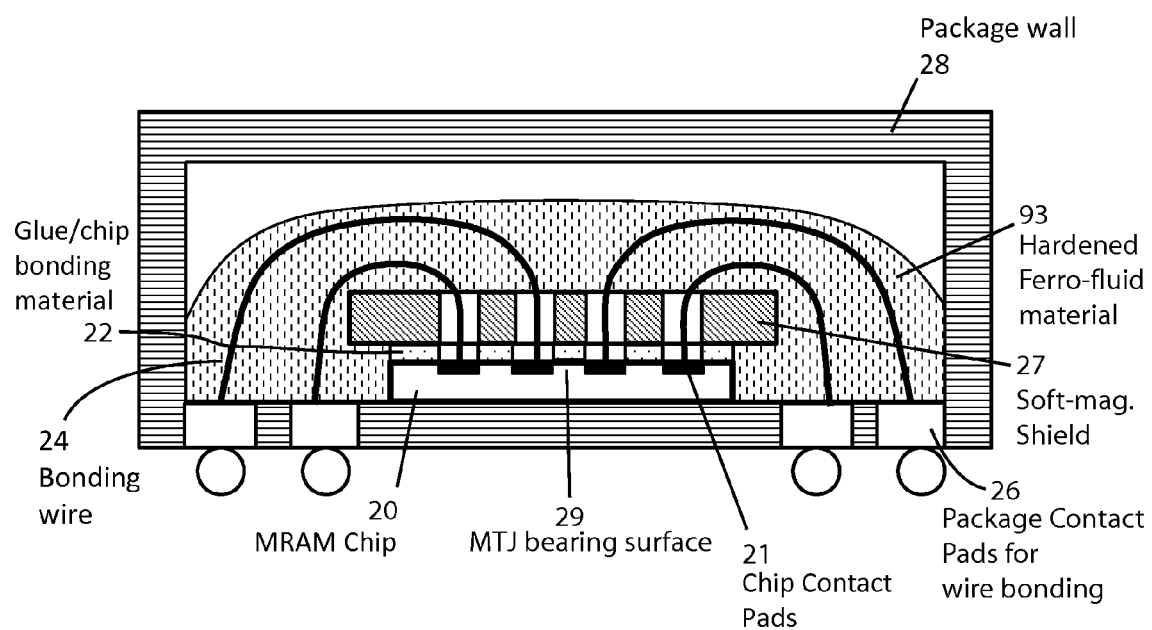
FIG. 12 illustrates a cross section view of a seventh embodiment of the invention using a shield with multiple via holes with an upward facing MRAM chip and additional magnetic shield formed from hardened ferro-fluid material deposited on top of the shield with multiple via holes.

FIG. 12 illustrates a cross section view of a seventh embodiment of the invention using a shield with multiple via holes with an upward facing MRAM chip and additional magnetic shield 93 formed from ferro-fluid material deposited on top of the shield 27 with multiple via holes. This embodiment is similar to the third embodiment with the addition magnetic shield 93 formed from ferro-fluid material. After shield 27 is is glued/bonded to the MRAM-chip and the wire bonding process is executed, a ferro-fluid material is deposited inside the package space to form magnetic shielding 93 on top of the shield 27. After wire bonding and before dropping in ferro-fluid material, an optional thin layer of insulating material can be deposited inside the package to insulate the MRAM chip and electrical connections from the hardened ferro-fluid material. Preferably, the ferro-fluid material is hardenable, where the hardenable ferro-fluid material specifications and deposition and hardening process are same as described above.

Figure 13:
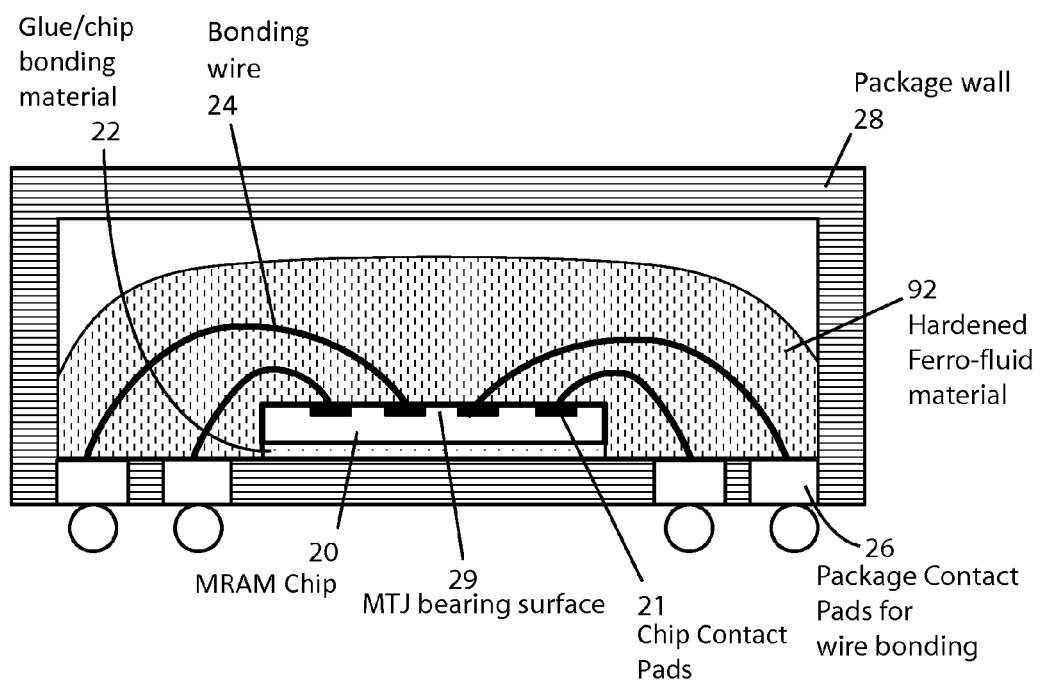
FIG. 13 illustrates a cross section view of a eight embodiment of the invention with an upward facing MRAM chip and magnetic shield formed from hardened ferro-fluid material deposited on top of the MRAM chip.

FIG. 13 illustrates a cross section view of a eight embodiment of the invention with an upward facing MRAM chip and magnetic shield 92 formed from ferro-fluid material deposited on top of the MRAM chip. After MRAM-chip being glued/bond to the package and wire bonding, a ferro-fluid material is deposited inside the package space to form magnetic shielding on the MRAM chip. Preferably, the ferro-fluid material is hardenable, where the hardenable ferro-fluid material specifications and deposition and hardening process are same as described above. As described previously an optional thin layer of insulating material can be deposited inside the package to insulate the MRAM chip and electrical connections from the hardened ferro-fluid material.

Figure 14:
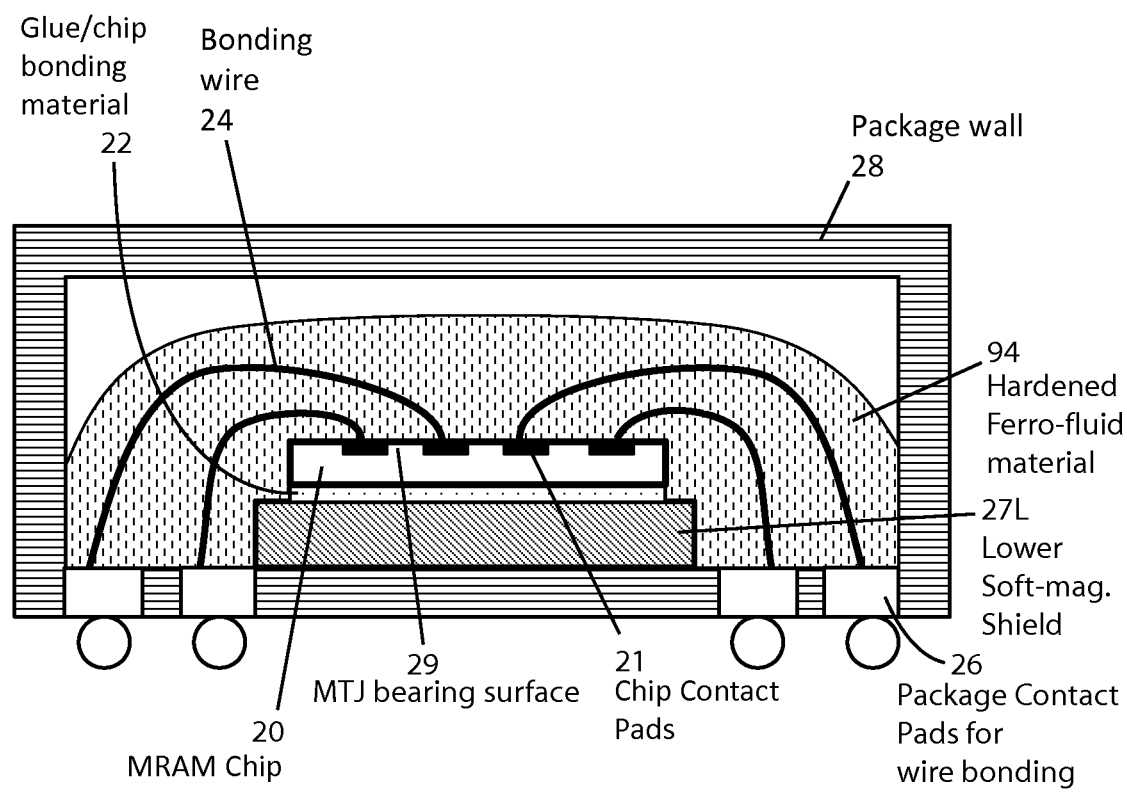
FIG. 14 illustrates a cross section view of a ninth embodiment of the invention with an upward facing MRAM chip, a lower magnetic shield and a magnetic shield formed from hardened ferro-fluid material deposited on top of the MRAM chip.

FIG. 14 illustrates a cross section view of a ninth embodiment of the invention with an upward facing MRAM chip, a lower magnetic shield 27L and magnetic shield 94 formed from ferro-fluid material deposited on top of the MRAM chip. Preferably, the ferro-fluid material is hardenable, where the hardenable ferro-fluid material specifications and deposition and hardening process are same as described above. As described previously an optional thin layer of insulating material can be deposited inside the package to insulate the MRAM chip and electrical connections from the hardened ferro-fluid material.

Figure 15:
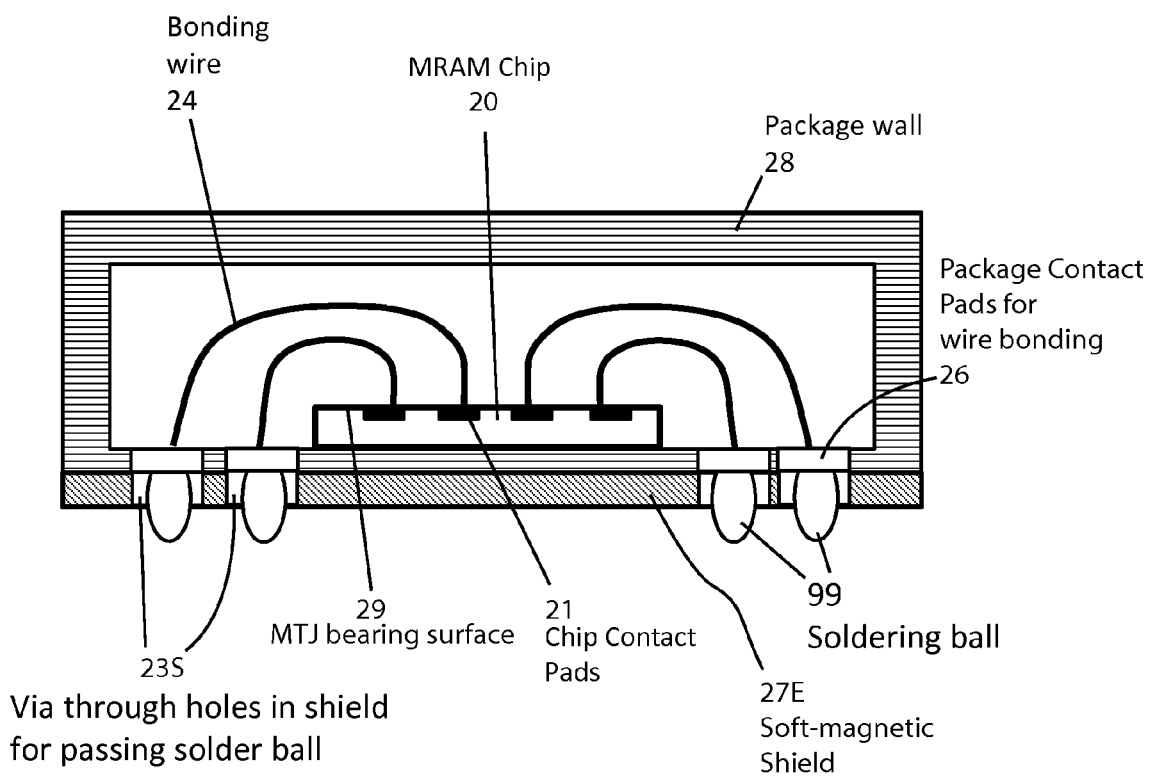
FIG. 15 illustrates a cross section view of a tenth embodiment of the invention with soft-magnetic shield (with VIA holes) that is externally attached to the bottom of the package.

FIG. 15 illustrates a cross section view of a tenth embodiment of the invention with soft-magnetic shield 27E (with VIA holes) that is externally attached to the bottom of the package 28. VIA holes 23S are designed to allow soldering balls to pass through the shield to make connection with the package contact pads 26. The MRAM chip is upward facing in this embodiment, but a downward facing chip embodiment can implemented using the techniques described above. Similarly embodiment 10 can be combined in alternative embodiments with other embodiments described above to provide additional shielding. As one example, a hardened ferro-fluid shield can be formed over the bonding wires. Upper and lower shields can be added as well.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

The invention claimed is:
1. A chip package including:
   an MRAM chip including a set of chip contact pads formed substantially flush with a first surface of the MRAM chip;
   a set of package contact pads disposed on an exterior surface of the package;
   a set of bonding wires electrically connecting the chip contact pads to the package contact pads;
   a first soft-magnetic shield disposed inside the package adjacent to the first surface of the MRAM chip, a surface of the first shield confronting the MRAM chip being larger than the first surface of the MRAM chip and extending beyond the MRAM chip on opposing sides, the first shield having at least one via with at least one bonding wire passing through the via; and a second soft-magnetic shield disposed adjacent to a second surface of the MRAM chip opposite to the first surface of the MRAM chip, the second soft-magnetic shield having an edge that extends toward and contacts the first shield, thereby encapsulating the MRAM chip.

2. The chip package of claim 1 wherein the second soft-magnetic shield has a thickness greater than a thickness of the MRAM chip measured along a selected line passing through the second soft-magnetic shield and the MRAM chip.

3. The chip package of claim 1 wherein the via is formed without corners.

4. The chip package of claim 1 wherein the first soft-magnetic shield is flexible.

5. The chip package of claim 1 wherein the first shield has a thickness equal to or greater than a thickness of the MRAM chip measured along a selected line passing through the first shield and the MRAM chip.

6. The chip package of claim 1 wherein the first shield is bonded to the MRAM chip.

7. The chip package of claim 1 wherein the first soft-magnetic shield is a homogeneous material that is an alloy of Fe and/or Co and any of the following Ni, Mn, Ir, Mg, Al, Ta, Ti, Pt, Pd, Ru, Cr, Cu, Hf, Zr, Si, C, Ge, W, Nb, Nd, Zn, Au, Ag, Cu, Mo, V, Ru, O and N.

8. The chip package of claim 1 wherein the first soft-magnetic shield is laminated and includes layers of soft magnetic material separated by non-magnetic spacer layers.

9. The chip package of claim 8 wherein the first soft-magnetic shield includes at least one layer of metallic magnetic foil.

10. The package of claim 1 wherein the second soft-magnetic shield is formed from a ferro-fluid.

11. The chip package of claim 10 wherein the ferro-fluid includes a polymer.

12. The chip package of claim 10 wherein the ferro-fluid includes oil, water, epoxy, silicone, or glue.

13. The chip package of claim 10 wherein the ferro-fluid is deposited as a flowing liquid and subsequently hardens.

14. The chip package of claim 12 wherein the ferro-fluid is hardened by heating or exposure to light.

15. The chip package of claim 1 wherein the first soft-magnetic shield includes magnetic particles in a non-magnetic matrix.

16. The chip package of claim 15 wherein the non-magnetic matrix is a non-magnetic metal or alloy, polymer, oxide, carbide, nitride, silicide, carbonate, sulfate, or silicon.

17. The chip package of claim 15 wherein the magnetic particles are composed of an alloy of Fe and/or Co and any of the following Ni, Mn, Ir, Mg, Al, Ta, Ti, Pt, Pd, Ru, Cr, Cu, Hf, Zr, Si, C, Ge, W, Nb, Nd, Zn, Au, Ag, Cu, Mo, V, Ru, O and N.

18. The chip package of claim 15 wherein the magnetic particles are ferromagnetic.

19. The chip package of claim 15 wherein the magnetic particles are ferri-magnetic.

20. The chip package of claim 15 wherein the magnetic particles are super-paramagnetic.

21. The chip package of claim 15 wherein the magnetic particles have a particle size less than one hundred microns.

22. The chip package of claim 15 wherein the magnetic particles have an approximate particle size from 5 nm to 500 nm.

23. The chip package of claim 1 wherein the first shield is disposed adjacent to an outer wall of the chip package.

24. A chip package including:
an MRAM chip including a set of chip contact pads formed substantially flush with a first surface of the MRAM chip;
a set of package contact pads disposed on an exterior surface of the package;
a set of bonding wires electrically connecting the chip contact pads to the package contact pads; and
a first soft-magnetic shield disposed inside the package adjacent to the first surface of the MRAM chip, a surface of the first shield confronting the MRAM chip being larger than the first surface of the MRAM chip and extending beyond the MRAM chip on opposing sides, the first shield having at least one via with at least one bonding wire passing through the via,
wherein the MRAM chip is disposed adjacent to an outer wall of the chip package and first surface of the MRAM chip with the set of chip contact pads faces away from the outer wall of the chip package and toward the first shield.

25. The chip package of claim 24 wherein a set of bonding wires extend out through vias in the first shield and pass through an interior area of the chip package before connecting to the set of package contact pads.

26. A chip package including:
an MRAM chip including a set of chip contact pads formed substantially flush with a first surface of the MRAM chip;
a set of package contact pads disposed on an exterior surface of the package;
a set of bonding wires electrically connecting the chip contact pads to the package contact pads;
a first soft-magnetic shield disposed inside the package adjacent to the first surface of the MRAM chip, a surface of the first shield confronting the MRAM chip being larger than the first surface of the MRAM chip and extending beyond the MRAM chip on opposing sides, the first shield having at least one via with at least one bonding wire passing through the via; and
a magnetically-soft, hardened ferro-fluid shield formed inside the chip package over a structure that includes the MRAM chip and the first soft-magnetic shield.

27. A chip package including:
an MRAM chip including a set of chip contact pads formed substantially flush with a first surface of the MRAM chip;
a set of package contact pads disposed on an exterior surface of the package;
a set of bonding wires electrically connecting the chip contact pads to the package contact pads; and
a first soft-magnetic shield disposed inside the package adjacent to the first surface of the MRAM chip, a surface of the first shield confronting the MRAM chip being larger than the first surface of the MRAM chip and extending beyond the MRAM chip on opposing sides, the first shield having at least one via with at least one bonding wire passing through the via,
wherein the first soft-magnetic shield is formed by two or more pieces of shield material juxtaposed to form the via.

* * * * *